United States Patent
Stauf et al.

(10) Patent No.: US 6,900,498 B2
(45) Date of Patent: May 31, 2005

(54) BARRIER STRUCTURES FOR INTEGRATION OF HIGH K OXIDES WITH CU AND AL ELECTRODES

(75) Inventors: Gregory T. Stauf, New Milford, CT (US); Bryan C. Hendrix, Danbury, CT (US); Jeffrey F. Roeder, Brookfield, CT (US); Ing-Shin Chen, New Milford, CT (US)

(73) Assignee: Advanced Technology Materials, Inc., Danbury, CT (US)

( * ) Notice: Subject to any disclaimer, the term of this patent is extended or adjusted under 35 U.S.C. 154(b) by 253 days.

(21) Appl. No.: 09/681,609

(22) Filed: May 8, 2001

(65) Prior Publication Data

US 2002/0167086 A1 Nov. 14, 2002

(51) Int. Cl.$^7$ .............................................. H01L 27/108
(52) U.S. Cl. ...................................... 257/310; 257/295
(58) Field of Search ................................ 257/295–296, 257/751, 310, 763–764, 303, 306; 438/3

(56) References Cited

U.S. PATENT DOCUMENTS

| | | | | |
|---|---|---|---|---|
| 5,453,908 A | * | 9/1995 | Tsu et al. ................. | 361/321.5 |
| 5,617,290 A | * | 4/1997 | Kulwicki et al. ........... | 361/313 |
| 5,729,054 A | * | 3/1998 | Summerfelt et al. ........ | 257/295 |
| 5,929,475 A | | 7/1999 | Uemoto et al. | |
| 5,985,731 A | * | 11/1999 | Weng et al. ................ | 438/396 |
| 6,168,991 B1 | | 1/2001 | Choi et al. | |
| 6,171,898 B1 | * | 1/2001 | Crenshaw et al. .......... | 438/240 |
| 6,180,446 B1 | * | 1/2001 | Crenshaw et al. .......... | 438/240 |
| 6,180,482 B1 | * | 1/2001 | Kang ......................... | 438/238 |
| 6,184,044 B1 | * | 2/2001 | Sone et al. ................. | 257/200 |
| 6,194,754 B1 | | 2/2001 | Aggarwal et al. | |
| 6,200,874 B1 | * | 3/2001 | Sandhu et al. .............. | 438/396 |
| 6,211,005 B1 | * | 4/2001 | Kang ................... | 257/E29.343 |
| 6,211,035 B1 | * | 4/2001 | Moise et al. ................ | 438/396 |
| 6,281,535 B1 | * | 8/2001 | Ma et al. .................... | 257/295 |
| 6,291,292 B1 | * | 9/2001 | Yang .......................... | 438/240 |
| 6,294,420 B1 | * | 9/2001 | Tsu et al. .................... | 438/239 |
| 6,320,213 B1 | * | 11/2001 | Kirlin et al. ................ | 257/295 |
| 6,358,810 B1 | * | 3/2002 | Dornfest et al. ..... | 257/E29.343 |
| 6,365,517 B1 | * | 4/2002 | Lu et al. ..................... | 438/683 |
| 6,380,579 B1 | * | 4/2002 | Nam et al. .................. | 257/295 |
| 6,417,537 B1 | * | 7/2002 | Yang et al. ................. | 257/298 |
| 6,462,931 B1 | * | 10/2002 | Tang et al. ................. | 361/305 |
| 6,593,638 B1 | * | 7/2003 | Summerfelt et al. ........ | 257/532 |
| 2001/0040249 A1 | * | 11/2001 | Jung ........................... | 257/295 |
| 2001/0044205 A1 | * | 11/2001 | Gilbert et al. .............. | 438/653 |
| 2002/0006674 A1 | * | 1/2002 | Ma et al. ....................... | 438/3 |
| 2002/0072223 A1 | * | 6/2002 | Gilbert et al. .............. | 438/629 |

OTHER PUBLICATIONS

U.S. Appl. No. 09/469,700, filed Dec. 22, 1999, Bryan C. Hendrix.

* cited by examiner

*Primary Examiner*—Hoai Pham
*Assistant Examiner*—Thao X. Le
(74) *Attorney, Agent, or Firm*—Margaret Chappuis; Steven Hultquist, Esq.

(57) ABSTRACT

An integrated circuit barrier structure disposed between high dielectric constant metal oxide and Cu or Al electrodes, for preventing diffusion of species such as oxygen, bismuth, or lead from the high dielectric constant metal oxide into the Cu or Al electrodes. Such barrier structure also protects the Cu or Al electrodes against oxidization during deposition of the high dielectric constant metal oxide. The barrier structure can be formed as (1) a single layer of Pt, Ir, $IrO_2$, $Ir_2O_3$, Ru, $RuO_2$, CuO, $Cu_2O$, $Al_2O_3$, or a binary or ternary metal nitride, e.g., TaN, NbN, HfN, ZrN, WN, $W_2N$, TiN, TiSiN, TiAlN, TaSiN, or NbAlN, or (2) double or triple layers of such materials, e.g., Pt/TiAlN, Pt/$IrO_2$, Pt/Ir, Ir/TiAlN, Ir/$IrO_2$, $IrO_2$/TiAlN, $IrO_2$/Ir, or $IrO_2$/$Ir_2O_3$/Ir. Such barrier structures enable Cu or Al electrodes to be used in combination with high dielectric constant metal oxides in microelectronic structures such as ferroelectric stack and trench capacitors, non-volatile ferroelectric memory cells, and dynamic random access memory (DRAM) cells.

39 Claims, 3 Drawing Sheets

BARRIER STRUCTURES FOR INTEGRATION OF HIGH K OXIDES WITH CU AND AL ELECTRODES

BACKGROUND OF INVENTION

1. Field of the Invention

The present invention relates to novel conductive barrier structures useful in integrated circuit memory cells, integrated capacitors for decoupling, integrated RC-matching networks or other electronic devices requiring high specific capacitance. In specific aspects, the present invention relates to microelectronic structures, e.g. including such conductive barrier layers between complex metal oxides of high dielectric constant and respective Cu or Al electrodes.

2. Description of the Related Art

Barrier layers are crucial components in many integrated circuits. Barrier layers are typically used to prevent interfacial diffusion of oxidizing species, silicon, metals, hydrogen, etc., while concurrently maintaining desired conductance/resistance characteristics in the integrated circuit structure.

Integrated circuit memory devices, such as dynamic random access memories (DRAMs), include storage cells comprising transfer transistors and capacitors, for temporarily storing information. There has been continuing improvement in IC devices with respect to the number of storage cells per device, for many years. Each increase of storage capacity is made possible by shrinking the amount of space, (i.e., the device surface area, occupied by each storage cell) by corresponding reduction of the size of its storage cell components.

In memory cells of such type, capacitance of the capacitor is particularly important since the capacitor"s ability to accurately store and "read out" bits of data is closely related to the quantity of charge that is able to be stored in the capacitor. In the past, capacitance has been kept high by forming three-dimensional capacitors such as trench capacitors and stacked capacitors. More recently, circuit designers have pursued capacitor structures including an insulator material with a high dielectric constant. High dielectric constant materials have been employed, having a dielectric constant much higher than the dielectric constant of such familiar materials as silicon dioxide ($SiO_2$) and silicon nitride ($Si_3N_4$).

Other applications of integrated capacitors also require higher capacitance and, by extension require higher dielectric constant materials as the dielectric layer. These applications include high performance decoupling capacitors, integrated RC (impedance) matching networks, other analog applications, and active circuit elements including electrically tunable capacitors, IR detectors, sensors, micromechanical machines and other more exotic circuit applications.

Commonly used high dielectric constant materials include complex metal oxides such as $SrBi_2Ta_2O_9$ (SBT), (Ba,Sr)$TiO_3$ (BST), and $Pb(Zr,Ti)O_3$ (PZT). It is well known that the optimal performance of these materials requires electrodes made from noble metals (i.e., Au and Pt), noble metal alloys, or oxides such as $RuO_2$, etc.

In addition, other intermediate dielectric constant materials such as $Ta_2O_5$ and alloys of tantalum and niobium oxides with other transition metal oxides can produce capacitors on non-noble metal electrodes, but like the high dielectric materials, their performance is optimized by the use of noble metal or noble metal oxide electrodes.

Noble metal electrodes possess many important physical or chemical characteristics, such as high oxidation resistance, high work function (providing reliable low leakage), a propensity to cause high dielectric constant oxides to crystallize easily on them, and high temperature stability. These characteristics are particularly crucial for bottom electrodes, which must withstand the stress of high temperature and oxidizing conditions during chemical vapor deposition (CVD) of high dielectric constant thin films thereon.

Unfortunately, such noble metals, noble metal alloys and oxides are very expensive and of limited availability for use in semiconductor production environments.

Moreover, such materials are very difficult to etch or to polish, and they require etching or polishing compositions of very strong acidity or corrositivity. Handling compositions of such strong acidity or corrositivity in turn increases the operating costs of the semiconductor manufacturing facility. Discharge of such etching or polishing compositions after the semiconductor manufacturing process also leads to significant environmental problems and/or treatment costs.

Further, such noble metals, alloys, and oxides, especially Pt and Pt alloys, have relatively low conductivity.

In view of the shortcomings of the above-described electrode materials of construction, aluminum and copper have come into usage as alternative electrode materials. Aluminum and copper have reduced cost compared to noble metals, and they have excellent conductivity.

However, both aluminum and copper have relatively high oxidization potentials and low oxidization resistances. They also are subject to rapid oxidization in a high-temperature, oxidizing environment. This in turn has adverse implications for the conventional method of forming the high dielectric constant oxide material, chemical vapor deposition (CVD). Chemical vapor deposition of complex metal oxides thin films of high dielectric constant (k) is generally carried out in an oxidizing environment under elevated deposition temperatures to ensure good crystallinity and electronic properties of such films. Electrodes comprising aluminum or copper cannot maintain their integrity under such chemical vapor deposition processes. This circumstance renders it difficult to use aluminum or copper electrodes in combination with high k metal oxide thin films.

Further, even without exposure to the chemical vapor deposition process, aluminum or copper is still susceptible to being oxidized at the Cu,Al/high k metal oxide interface, by oxygen diffusion through such interface. The resultant generation of Cu oxides or Al oxides roughens the Cu,Al/high k metal oxide interface and changes local electrical properties at or near the interface. Typical electrical property changes include, but are not limited to, increased leakage and energy loss. Severe leakage and energy loss will in turn cause catastrophic breakdown (i.e., a short-circuit) between the electrodes and render the capacitor useless.

The present invention therefore relates to use of various barrier layers between the complex metal oxides of high dielectric constant and the Cu or Al electrodes, to avoid the above-discussed problems.

SUMMARY OF INVENTION

Summary of the invention The present invention relates to conductive barrier structures useful in integrated circuit memory cells or other electronic devices utilizing Cu or Al electrodes.

In one aspect, the present invention relates to a microelectronic structure, comprising: at least one layer of high dielectric constant material; at least one conductive barrier layer in contact with the layer of high dielectric constant material, wherein such conductive barrier layer comprises at least one material selected from the group consisting of Pt, Ir, $IrO_2$, $Ir_2O_3$, Ru, $RuO_2$, binary metal nitrides, ternary metal nitrides, and compatible combinations, mixtures and alloys thereof; at least one metal layer in contact with the conductive barrier layer, wherein said metal layer comprises metal or metal alloy including a material selected from the group consisting of Cu and Al.

As used herein, the phrase "high dielectric constant" means a dielectric constant not less than about 30 at room temperature.

High dielectric constant materials useful for the practice of the present invention include, but are not limited to, $SrBi_2Ta_2O_9$ (SBT), $(Ba,Sr)TiO_3$ (BST), $Bi_{2x}Ta_{2y}O_{3x+5y}$ (BT), and $Pb(Zr,Ti)O_3$ (PZT). The BST material is preferably perovskite crystal of excellent crystallinity, but amorphous BST material may also be advantageously employed to suit specific application requirements.

Other materials useful for the practice of the present invention are more fully disclosed and claimed in U.S. patent application Ser. No. 09/469,700, filed Dec. 22, 1999, in the name of Bryan C. Hendrix, for "Low Temperature Process for High Density Thin Film Integrated Capacitors, and Amorphously Frustrated Ferroelectric Materials Therefor," the disclosure of which hereby is incorporated herein by reference in its entirety.

For example, the high dielectric constant material comprises amorphous metal oxide thin film materials of a composition that is ferroelectric in both crystalline thin film and crystalline bulk forms, or amorphous metal oxide thin film materials that are compositionally related to such ferroelectric compositions, but which are "away from" the ferroelectric materials, i.e., off-stoichiometric in relation thereto. Specifically, such thin film amorphous dielectric materials have a voltage independent capacitance, a capacitance density in the range of from about 1000 to about 10000 $nF/cm^2$, and a current leakage of $<10^{-7}$ $A/cm^2$.

The thin film materials of the invention may be of a widely varied type, including compositions that are highly ferroelectric or anti-ferroelectric in their bulk crystalline farina. Highly A-site ($ABO_3$) deficient materials may be employed for such purpose. More specifically, PbO or $Bi_2O_3$ additions to oxides of titanium, zirconium, hafnium, vanadium, niobium, tantalum, chromium, molybdenum, tungsten, etc., may be utilized to yield high k amorphous films. Particularly preferred high k amorphous film materials include barium titanate, strontium titanate, barium strontium titanate, strontium bismuth tantalate, bismuth titanate, lead zirconium titanate, and the like. Alloying of the amorphous film materials with La, Nb, Zr, Hf, W, and Ba may be employed to produce high k amorphous films.

In one specific preferred embodiment of the invention, the amorphously frustrated ferroelectric material comprises a bismuth oxide material (e.g., $SrBi_2Ta_2O_9$, $Bi_4Ti_3O_{12}$, etc.), as grown by MOCVD to produce films that are substantially completely amorphous by x-ray diffraction (XRD) characterization.

In another specific preferred embodiment of the invention, the amorphously frustrated ferroelectric material comprises a $(Ba,Sr)TiO_3$ (BST) material, as grown by MOCVD to produce films that are substantially completely amorphous by x-ray diffraction (XRD) characterization.

The amorphous paraelectric films of the invention may be formed in any suitable manner, wherein the oxide film is deposited and subsequently processed at a temperature below about 500° C., and more preferably below about 400° C. Among possible deposition techniques are physical vapor deposition, sputtering, solution deposition, and assisted (plasma, x-ray, e-beam, etc.) and unassisted chemical vapor deposition.

The preferred deposition process is liquid delivery metalorganic chemical vapor deposition (liquid delivery MOCVD).

The conductive barrier layer may comprise a single layer of barrier materials. Double-layer and triple-layer structures can also be formed for enhanced diffusion resistance and better adhesion with the high dielectric constant material layer as well as with the metal electrode layer.

In preferred practice, the conductive barrier layer has a thickness not exceeding about 100 nm. Additionally, in order to sufficiently prevent oxygen diffusion, such barrier layer desirably has a thickness of not less than 1 nm. Preferably, the thickness of the conductive barrier layer is in a range from about 5 nm to 20 nm.

The term "binary or ternary metal nitrides" herein refers to a material containing nitrogen and at least one metal species, with binary denoting one metal species in the composition and ternary denoting the presence of two metal species in the composition.

Useful binary or ternary metal nitrides for forming the conductive barrier layer include, but are not limited to, TaN, NbN, HfN, ZrN, WN, $W_2N$, TiN, TiSiN, TiAlN, TaSiN, and NbAlN. Preferably such conductive barrier layer comprises TiAlN.

Cu or Cu alloy is desirably employed as a material for forming the metal electrodes in the practice of the present invention, due to its excellent conductivity and high melting point. Alternatively, the metal electrodes may be formed of Al or Al alloys. It is also within the purview of the present invention to utilize Ag or Au or combinations of metals, such as mixtures and alloys containing both Cu and Al.

In one aspect, the present invention relates to a microelectronic structure comprising a double-layer barrier structure, wherein a first conductive barrier layer is in contact with a layer of high dielectric constant material on one side, and a second conductive barrier layer overlays such first conductive barrier layer and is in contact with a Cu or Al metal layer on the other side.

In a specific embodiment of such type, the first conductive barrier layer comprises Pt, while the second conductive barrier layer comprises $IrO_2$, TiAlN, or Ir. In another embodiment, the first conductive barrier layer comprises Ir, while the second conductive barrier layer comprises $IrO_2$ or TiAlN. In yet another embodiment, the first conductive barrier layer comprises $IrO_2$, while the second conductive barrier layer comprises Ir or TiAlN.

Another aspect of the present invention relates to a microelectronic structure comprising a triple-layer barrier structure, with a first layer in contact with high dielectric constant material, a second layer overlaying said first layer, and a third layer overlaying said second layer and in contact with a Cu or Al electrode.

In a specific embodiment of such type, the triple-layer barrier structure comprises a first layer of $IrO_2$, a second layer of $Ir_2O_3$, and a third layer of Ir. Such triple-layer barrier structure may be fabricated by first forming a single layer of Ir and then subjecting such Ir layer to a graded oxidization process, resulting in Ir oxides of different oxidization states.

Yet another aspect of the present invention relates to a microelectronic structure comprising: at least one layer of perovskite BST material; a first conductive barrier layer in contact with the layer of perovskite BST material and comprising Pt; a second conductive barrier layer overlaying said first conductive barrier layer and comprising Ir; and at least one metal layer in contact with said second conductive barrier layer and comprising Cu or Cu alloy.

In another embodiment, the microelectronic structure comprises: at least one layer of amorphous BST material; a conductive barrier layer in contact with the layer of amorphous BST material, comprising at least one material selected from the group consisting of Ir and $IrO_2$; and at least one metal layer in contact with the conductive barrier layer, and comprising Cu or Cu alloy.

In another embodiment, the microelectronic structure comprises: at least one layer of amorphous SBT material; a conductive barrier layer in contact with the layer of amorphous SBT material, comprising at least one material selected from the group consisting of Ir and binary or tertiary nitrides such as, TiN, TiAlN; TaN, and TaSiN, and at least one metal layer in contact with the conductive barrier layer, and comprising Cu or Cu alloy.

In another embodiment, the microelectronic structure comprises: at least one layer of amorphous BT material; a conductive barrier layer in contact with the layer of amorphous BT material, comprising at least one material selected from the group consisting of Ir and binary or tertiary nitrides such as, TiN, TiAlN; TaN, and TaSiN, and at least one metal layer in contact with the conductive barrier layer, and comprising Cu or Cu alloy.

In yet another embodiment, the microelectronic structure comprises: at least one layer of PZT material; a conductive barrier layer in contact with the layer of PZT material, comprising at least one material selected from the group consisting of Ir and $IrO_2$; and at least one metal layer in contact with the conductive barrier layer, comprising Cu or Cu alloy.

Other aspects, features, and embodiments of the invention will be more fully apparent from the ensuing disclosure and appended claims.

DETAILED DESCRIPTION

Figure 1:
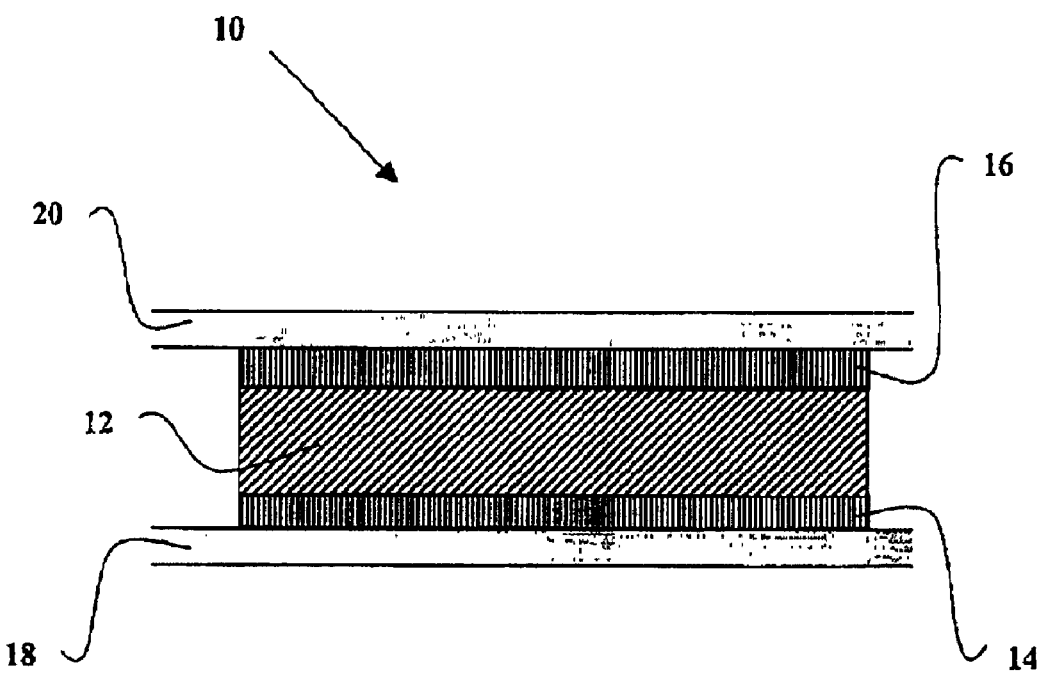
FIG. 1 is a schematic representation of a generalized high dielectric constant capacitor.

The disclosure of U.S. patent application Ser. No. 09/469,700, filed Dec. 22, 1999, in the name of Bryan C. Hendrix, for "Low Temperature Process for High Density Thin Film Integrated Capacitors, and Amorphously Frustrated Ferroelectric Materials Therefor," is hereby incorporated herein by reference in its entirety: The present invention relates to conductive barrier structures between oxidizable Cu or Al electrodes and dielectric or ferroelectric metal oxides of high dielectric constant. Specifically, the present invention relates to a microelectronic structure incorporating such conductive barrier structures to stabilize Cu and/or Al electrodes against deleterious oxidization caused either by oxygen diffusion from the high dielectric constant metal oxides or by the high temperature oxidizing conditions during chemical vapor deposition of such high k metal oxides.

The microelectronic structure of the present invention can be incorporated or employed in various electronic or microelectronic devices, including but not limited to, dielectric or ferroelectric capacitors, integrated memory cell structures, dynamic random access memory cells (DRAMs), ferroelectric random access memory cells (FeRAMs), integrated capacitors for decoupling, electrically tunable capacitors, integrated RC-matching networks, thin film pyroelectric devices (e.g., cooled and uncooled infrared detectors), thin-film piezoelectric devices, and thin-film electro-optic devices.

Pt, Ir, $IrO_2$Ru, or $RuO_2$ materials have excellent compatibility with high dielectric constant materials such as SBT, BST, BT, and PZT. Such noble metals are also highly resistant to oxidization, even under elevated temperatures. However, their relatively high electrical resistivity (usually about 2.5–10 $\mu\Omega$/cm or higher) and high prices render them less desirable as electrode materials in large-scale semiconductor manufacturing processes.

The present invention employs such noble metals or noble metal oxides in forming oxidization-resistant barrier, instead of as electrode materials of construction, in connection with the use of high dielectric constant metal oxides and Cu/Al electrodes. The combined use of noble metals or noble metal oxides with Cu or Al electrodes in accordance with the present invention provides the following advantages: (1) electronic stability; (2) low manufacturing cost; (3) high conductivity; (4) high uniformity of properties along the metal/high k metal oxide interface.

Additionally, binary or ternary metal nitrides of sufficient oxygen diffusion resistance can also be used, alone or in combination with the aforementioned noble metals or noble metal oxides, to form Cu/Al-protective barrier layers in the practice of the present invention.

Useful binary or ternary metal nitrides for the practice of the present invention include, but are not limited to, TaN, NbN, HfN, ZrN, WN, $W_2N$, TiAlN, and NbAlN. In contrast to common nitrides of tantalum and tungsten, the nitrides NbN, HfN, ZrN, TiAlN and NbAlN are referred to as "exotic nitrides". The exotic nitrides generally oxidize very slowly compared with TiN. As a consequence, such exotic nitrides have sufficient oxidization resistance to survive the high temperature oxidizing environment during chemical vapor deposition of the high dielectric metal oxides layer. However, depending on the dielectric deposition process conditions, TiN and ternary nitrides based on TiN may be employed, especially at lower dielectric deposition temperatures, such as those used in MOCVD of amorphous SBT and BT.

A particularly preferred embodiment of the present invention uses TiAlN as a component of the conductive barrier layer. Other binary or ternary metal nitrides can also be usefully employed, depending on specific processing conditions and the particular types of metal oxides layers deposited. One of ordinary skill in the art can readily choose suitable components of the conductive barrier layer to achieve a desired result without undue experimentation.

The conductive barrier structure of the present invention can comprise a single layer of barrier materials. It can alternatively comprise multiple layers of barrier materials to achieve better results.

In general, it is preferable to use simpler barrier structures not comprising more than three layers, for reasons of reduced manufacturing cost as well as reduced risk of delamination of the barrier structure. Simple barrier structures comprising one or two layers of conductive barrier materials are especially preferred.

Preferably, the amount of noble metal(s) or exotic nitride (s) employed in the microelectronic structure of the present invention is minimal compared to the amount of Cu/Al electrode material, so that the manufacturing cost of such microelectronic structure can be maintained at a suitably low level, and so that etching of such microelectronic structure is readily effected without having to remove thick layers of less reactive noble metals or metal nitrides.

For these reasons, it is preferred to form conductive barrier structures having a thickness in the range from about 1 nm to about 100 nm, and preferably from about 5 nm to about 100 nm.

Referring now to the drawings, FIG. 1 shows a generalized high dielectric constant capacitor 10 as one type of microelectronic structure according to the present invention. As illustrated in FIG. 1, high k capacitor 10 comprises a metal oxide layer 12 of high dielectric constant. Two conductive barrier layers 14 and 16 are in direct contact with such metal oxide layer 10. Cu or Al electrode layers 18 and 20 overlay such conductive barrier layers 14 and 16 on their respective outer surfaces.

Such capacitor 10 may be incorporated in a large integrated circuit or other electronic device. The capacitor can for example be placed on a semiconductor substrate having vias and plugs therein (not shown).

It is to be appreciated that the capacitor 10 in FIG. 1 is illustratively depicted as a generalization of various capacitor structures, for ease of understanding. In commercial embodiments, the capacitor can be substantially planar with multiple layers of electrodes and dielectric materials. The capacitor can take the form of stack capacitors or trench capacitors with high aspect ratios, wherein the sides of the electrodes contribute substantially to the total surface area of the electrodes in contact with the high dielectric constant metal oxide. The capacitor can also take various other forms and conformations, as readily determinable by a person of ordinary skill in the art.

Figure 2:
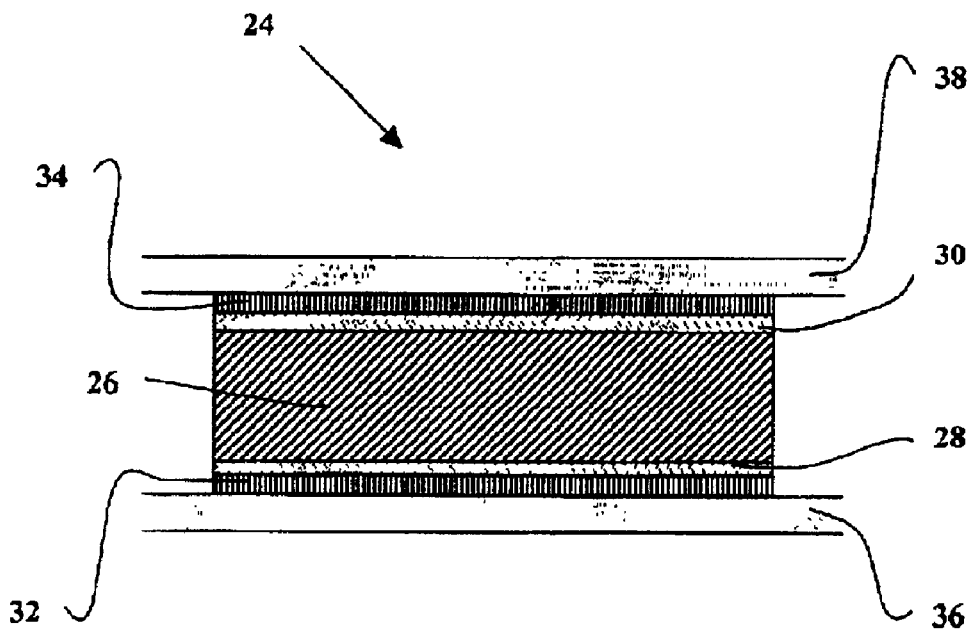
FIG. 2 is a schematic representation of a high dielectric constant capacitor with a double-layer barrier structure.

FIG. 2 is a schematic representation of a high k capacitor 24 with a double-layer barrier structure, according to a particular embodiment of the present invention. Capacitor 24 features a high dielectric constant layer 26, comprising a metal oxide such as SBT, BST, BT, PZT, or combinations thereof. The capacitor structure also comprises two Pt layers 28 and 30, which are in direct contact with the high k layer 26 on both sides thereof. Additionally, two $IrO_2$ layers 32 and 34 overlay such Pt layers and are in direct contact with the outer Cu or Al electrodes 36 and 38, respectively.

This Pt/$IrO_2$ double-layer structure has enhanced diffusion resistance compared with a single Pt layer, with the $IrO_2$ layer providing a superior barrier against diffusion of oxygen, bismuth, or lead.

Such double-layer structure also has enhanced compatibility with the high dielectric constant metal oxides layer, compared with a single $IrO_2$ layer. Additionally, the Pt layer serves as a good template in the two-layer barrier structure.

As a further advantage of such double-layer barrier structure, both Pt and $IrO_2$ have high oxidization resistance and are not oxidized even at temperatures above 600° C. Accordingly, Cu or Al electrodes protected by such barrier structure will survive the high temperature, oxidizing environment of the chemical vapor deposition process used to deposit the high k metal oxide.

Figure 3:
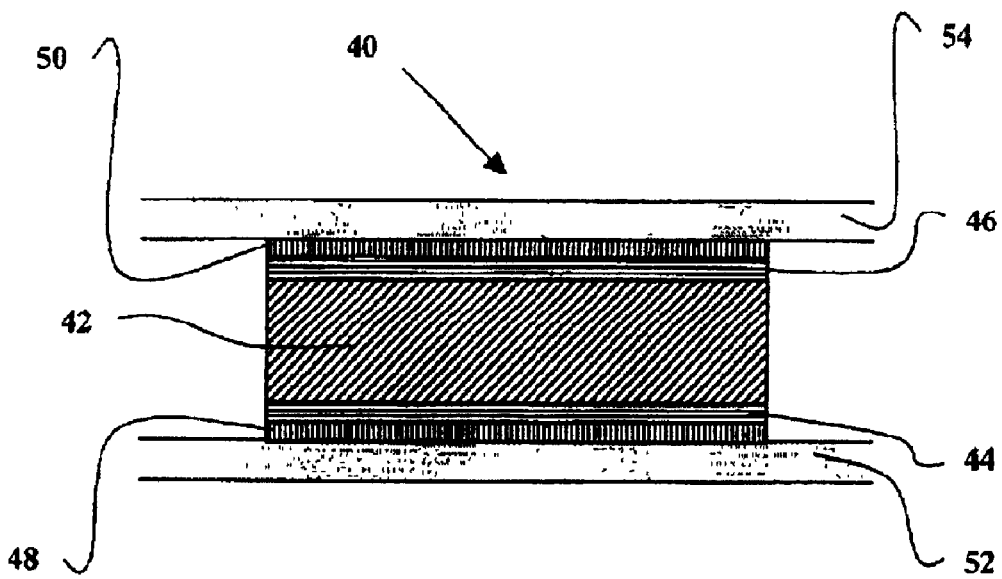
FIG. 3 is a schematic representation of a high dielectric constant capacitor with a double-layer barrier structure.

FIG. 3 shows another high k capacitor 40 having a double-layer barrier structure, according to another embodiment of the present invention.

Capacitor 40 comprises a high k metal oxide layer 42, sandwiched between two $IrO_2$ layers 44 and 46. Two TiAlN layers 48 and 50 further overlay $IrO_2$ layers 44 and 46 on respective outer surfaces thereof, and contact outer Cu or Al electrodes 52 and 54, respectively.

The $IrO_2$/TiAlN double-layer barrier structure is a particularly preferred embodiment of the present invention. TiAlN is an excellent oxygen barrier for preventing oxygen diffusion from the high k metal oxide to the underlying or overlying Cu or Al electrode.

At lower film growth temperatures, such as those in the range of from about 350° C. to about 450° C. that are used for forming amorphous SBT films, an unprotected TiAlN barrier layer may be compatable in the CVD process. However, when the growth temperature increases to a level in the range of from about 600° C. to about 650° C. or even higher, as generally used for depositing perovskite BST films, TiAlN becomes increasingly vulnerable to oxidizing co-reactants in the CVD reaction chamber.

Accordingly, the use of an additional $IrO_2$ layer can serve protect TiAlN from being oxidized under elevated temperatures. In addition, $IrO_2$ is compatible with high k metal oxides.

Figure 4:
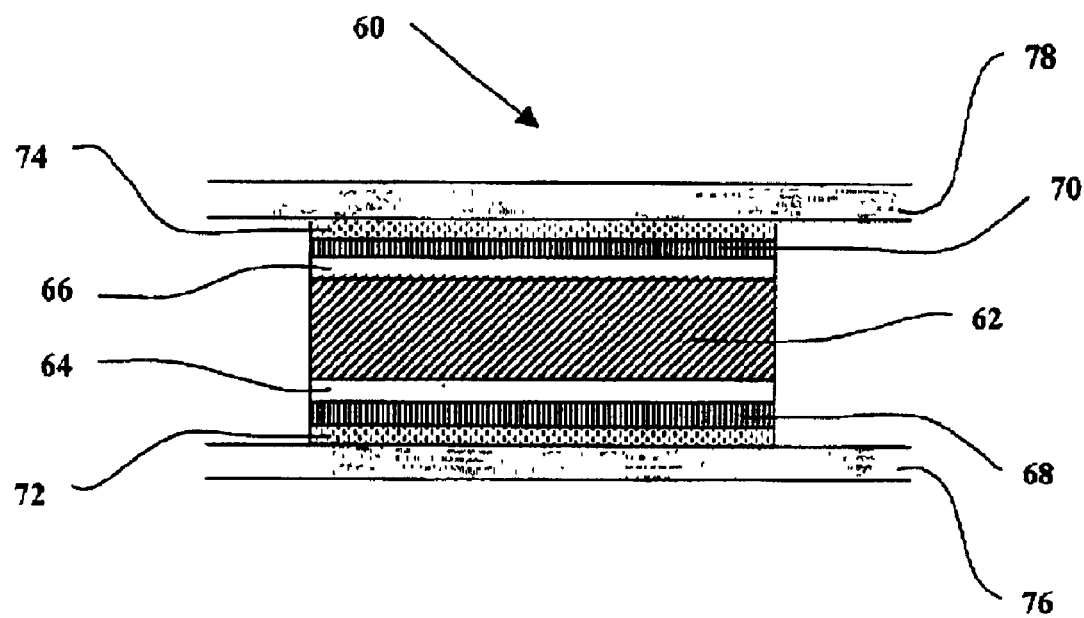
FIG. 4 is a schematic representation of a high dielectric constant capacitor with a triple-layer barrier structure.

FIG. 4 shows a high dielectric constant capacitor 60 comprising a triple-layer barrier structure.

Capacitor 60 comprises a high dielectric constant layer 62, which may include a complex metal oxide such as SBT, BST, BT, PZT, or a combination thereof. Two $IrO_2$ layers 64 and 66 are in direct contact with the high k layer 62 on both respective sides thereof, and two $Ir_2O_3$ layers 68 and 70 overlie the $IrO_2$ layers. Two Ir layers 72 and 74 overlie the respective $Ir_2O_3$ layers and directly contact the respective outer Cu or Al electrodes 76 and 78.

For particular material systems using different high k metal oxides, suitable barrier structures are readily determinable in accordance with the invention, to achieve desired results.

For example, for microelectronic structures using a perovskite BST material, whose deposition temperature is from about 600° C. to 660° C., a Pt/Ir barrier structure is advantageously employed, with a Pt layer overlying the dielectric perovskite BST material, and an Ir layer contacting Cu electrodes.

For microelectronic structures using amorphous BST materials, which are deposited at lower growth temperatures in the range of from about 540° C. to about 620° C., an Ir, Ru $IrO_2$ or $RuO_2$ barrier layer can be advantageously employed between the amorphous BST layer and the Cu electrodes.

For microelectronic structures using PZT materials, which can be formed by chemical vapor deposition at temperatures in the range of from about 450 to about 600° C., an Ir or $IrO_2$ barrier layer can also be used.

For microelectronic structures using amorphous SBT films, an Ir or nitride, e.g., TiAlN, barrier layer can be used for protecting the Cu electrodes, because the growth temperature of amorphous SBT films is relatively low, compared with growth temperatures of other high k metal oxides films, which are generally in a range of from about 350° C. to about 450° C.

Many different types of processes known in the art may be used to deposit the various layers of the microelectronic device structure including barrier structures according to the present invention. For example, processes that may be advantageously employed include sputtering, reactive sputtering, sputtering with and without collimation/other enhancements, evaporation, and metallorganic chemical vapor deposition.

Layers that are described herein as alloys, compounds, mixtures, etc., are meant to be intentionally formed and substantial layers, as opposed to incidental partial mixtures of components of adjacent separate layers that may be incidentally formed at the interface of those layers.

EXAMPLE 1

Figure 5:
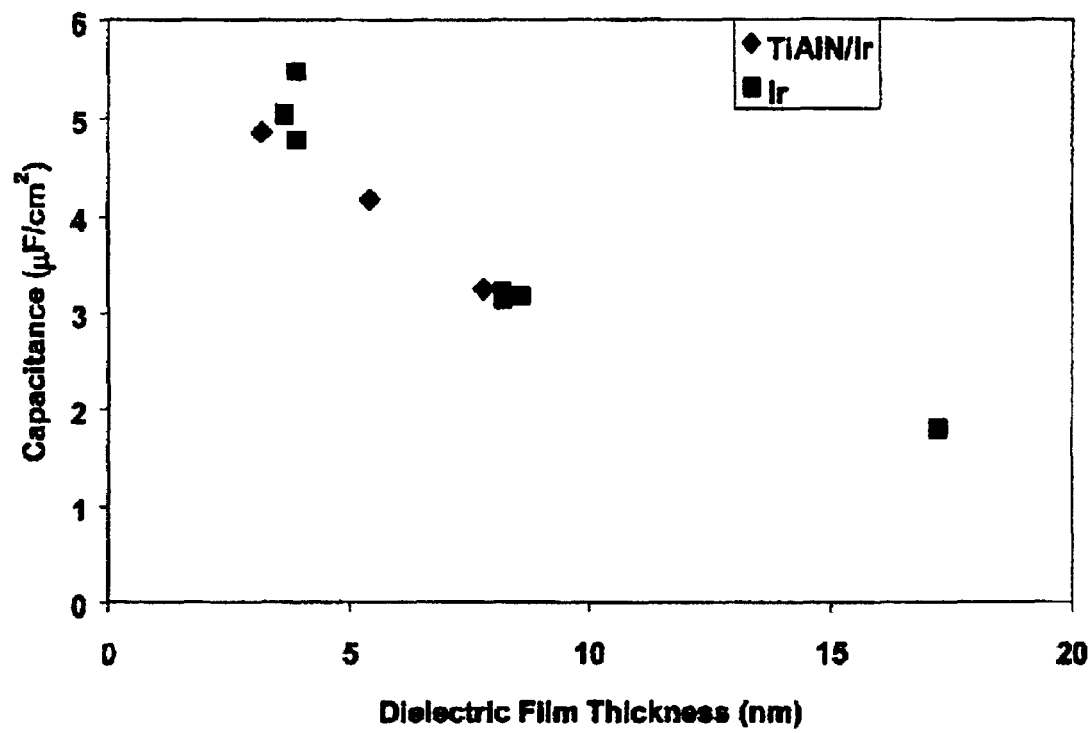
FIG. 5 is a plot of capacitance per unit area as a function of dielectric film thickness for amorphous $BiTaO_4$ films on TiAlN/Ir electrodes.

Amorphous $BiTaO_4$ films are deposited onto two types of substrates: 100 nm Ir on 500 $SiO_2$ on (100) Si and 10 nm TiAlN on 100 nm Ir on 500 nm $SiO_2$ on (100) Si. In both cases the film thickness was determined by calibrated X-ray Fluorescence (XRF) using a mixture of the ideal densities for $Bi_2O_3$ and $Ta_2O_5$ to calculate thickness. Top electrodes of 100 nm Pt were deposited by electron beam evaporation through a shadow mask to define pads between $10^{-4}$ to $10^{-3}$ cm$^2$ in area. The capacitance was measured using a HP4192A meter. The capacitance per unit area is shown in FIG. 5 as a function of dielectric film thickness for both electrode structures. Surprisingly, equivalent capacitance values for the same thickness of dielectric film were observed, indicating that there are no capacitive interlayers formed between the dielectric and the TiAlN interlayer.

While the invention has been described herein with reference to illustrative features, aspects, and embodiments, it will be appreciated that the utility of the invention is not thus limited, but rather extends to and encompasses numerous other variations, modifications, and other embodiments, as will readily suggest themselves to those skilled in the art based on the disclosure herein. The claims hereinafter set forth are therefore intended to be broadly construed and interpreted, to comprehend all such variations, modifications and other embodiments, as being within the spirit and scope of the invention.

What is claimed is:

1. A microelectronic structure comprising:
   at least one layer of high dielectric constant material comprising amorphous dielectric metal oxide having;
   (i) A voltage independent capacitance, (ii) a capacitance density of from about 1000 to 10,000 nF/cm$^2$, and (iii) a current leakage of $<10^{-7}$ A/cm$^2$;
   at least one conductive barrier layer in contact with the layer of high dielectric constant material, wherein such conductive barrier layer comprises at least one material selected from the group consisting of Pt, Ir, $IrO_2$, $Ir_2O_3$, Ru, $RuO_2$, TaN, NbN, HfN, ZrN, WN, $W_2N$, Tin, TiSiN, TiAlN, TaSin, NbAlN, and compatible combinations, mixtures and alloys thereof;
   at least one metal layer in contact with the conductive barrier layer, wherein said metal layer comprises metal or metal alloy including a material selected from the group consisting of Cu and Al;
   wherein said at least one conductive barrier layer is between said at least one layer of high dielectric constant material and said at least one metal layer.

2. A microelectronic structure according to claim 1, wherein said conductive barrier layer comprises one material selected from the group consisting of TaN, NbN, HfN, ZrN, WN, $W_2N$, TiN, TiSiN, TiAlN, TaSiN, and NbAlN.

3. A microelectronic structure according to claim 1, wherein said conductive barrier layer comprises TiAlN.

4. A microelectronic structure according to claim 1, wherein said metal layer comprises Cu or Cu alloy.

5. A microelectronic structure according to claim 1, wherein said metal layer comprises Al or Al alloy.

6. A microelectronic structure according to claim 1, wherein said amorphous dielectric metal oxide is selected from the group consisting of $SrBi_2Ta_2O_9$ (SBT), (Ba,Sr)$TiO_3$ (BST), $BiTaO_4$ (BT), $Bi_4Ti_3O_{12}$, barium titanate strontium titanate, barium strontium titanate, strontium bismuth tantalate, bismuth titanate, and lead zirconium titanate.

7. A microelectronic structure according to claim 1, wherein said layer of high dielectric constant material comprises amorphous SBT material.

8. A microelectronic structure according to claim 1, wherein said layer of high dielectric constant material comprises amorphous BST material.

9. A microelectronic structure according to claim 1, wherein said conductive barrier layer has a thickness in a range of from about 1 nm to about 100 nm.

10. A microelectronic structure according to claim 1, wherein said conductive barrier layer has a thickness in a range of from about 5 nm to about 20 nm.

11. A microelectronic structure according to claim 1, wherein said conductive barrier layer comprises Pt.

12. A microelectronic structure according to claim 1, wherein said conductive barrier layer comprises Ir.

13. A microelectronic structure according to claim 1, wherein said conductive barrier layer comprises $IrO_2$.

14. A microelectronic structure according to claim 1, wherein said conductive barrier layer comprises Ru.

15. A microelectronic structure according to claim 1, wherein said conductive barrier layer comprises $RuO_2$.

16. A microelectronic structure according to claim 1, wherein said conductive barrier layer comprises TiAlN.

17. A microelectronic structure according to claim 1, wherein said conductive barrier layer comprises TaN.

18. A microelectronic structure according to claim 1, comprising a first conductive barrier layer and a second conductive barrier layer, wherein the first conductive barrier layer is in contact with the layer of high dielectric constant material, and the second conductive barrier layer overlies said first conductive barrier layer and is in contact with the metal layer.

19. A microelectronic structure according to claim 18, wherein said first conductive barrier layer comprises Pt, and said second conductive barrier layer comprises $IrO_2$.

20. A microelectronic structure according to claim 18, wherein said first conductive barrier layer comprises Pt, and said second conductive barrier layer comprises TiAlN.

21. A microelectronic structure according to claim 18, wherein said first conductive barrier layer comprises Pt, and said second conductive barrier layer comprises Ir.

22. A microelectronic structure according to claim 18, wherein said first conductive barrier layer comprises Ir, and said second conductive barrier layer comprises $IrO_2$.

23. A microelectronic structure according to claim 18, wherein said first conductive barrier layer comprises Ir, and said second conductive barrier layer comprises TiAlN.

24. A microelectronic structure according to claim 18, wherein said first conductive barrier layer comprises $IrO_2$, and said second conductive barrier layer comprises Ir.

25. A microelectronic structure according to claim 18, wherein said first conductive barrier layer comprises $IrO_2$, and said second conductive barrier layer comprises TiAlN.

26. A microelectronic structure according to claim 1, comprising a first conductive barrier layer, a second conductive barrier layer, and a third conductive barrier layer, wherein said first conductive barrier layer is in contact with the layer of high dielectric constant material, said second conductive barrier layer overlies said first conductive barrier layer, and said third conductive barrier layer overlies said second conductive barrier layer and is in contact with the metal layer.

27. A microelectronic structure according to claim 1, comprising:
   a first conductive barrier layer in contact with the layer of high dielectric constant material, and comprising Pt;
   a second conductive barrier layer overlaying said first conductive barrier layer, and comprising Ir.

28. A microelectronic structure according to claim 1, comprising:
   at least one layer of amorphous BST material;
   a conductive barrier layer in contact with the layer of amorphous BST material, comprising at least one material selected from the group consisting of Ir, Ru, $RuO_2$, and $IrO_2$;
   at least one metal layer in contact with the conductive barrier layer, comprising Cu or Cu alloy.

29. A microelectronic structure according to claim 1, comprising:
   at least one layer of amorphous SBT material;
   a conductive barrier layer in contact with the layer of amorphous SBT material, comprising at least one material selected from the group consisting of Ir, Ru, TaN, TiN and TiAlN;
   at least one metal layer in contact with the conductive barrier layer, comprising Cu or Cu alloy.

30. A microelectronic structure according to claim 1, comprising:
   at least one layer of amorphous lead zirconium titanate material;
   a conductive barrier layer in contact with the layer of amorphous lead zirconium titanate material, comprising at least one material selected from the group consisting of Ir, Ru, $RuO_2$, and $IrO_2$;
   at least one metal layer in contact with the conductive barrier layer, comprising Cu or Cu alloy.

31. A microelectronic structure according to claim 1, comprising a capacitor structure selected from the group consisting of stack capacitors and trench capacitors.

32. A microelectronic structure according to claim 1, comprising a memory cell integrated circuit structure.

33. A microelectronic structure according to claim 32, wherein the memory cell integrated circuit structure comprises a non-volatile memory cell integrated circuit structure.

34. A microelectronic structure according to claim 32, wherein the memory cell integrated circuit structure comprises a dynamic random access memory cell integrated circuit structure.

35. A microelectronic structure according to claim 1, wherein the integrated circuit structure comprises a decoupling circuit.

36. A microelectronic structure according to claim 1, wherein the integrated circuit structure comprises an impedance matching circuit.

37. A microelectronic structure according to claim 1, wherein the integrated circuit structure comprises an analog circuit component.

38. A microelectronic structure according to claim 1, wherein the integrated circuit structure comprises an active circuit element selected from the group consisting of electrically tunable capacitor, sensor, and microelectromechanical machine MEMS).

39. A microelectronic structure comprising:
   at least one layer of high dielectric constant material;
   a first conductive barrier layer comprises $IrO_2$, a second conductive barrier layer comprises $Ir_2O_3$, and a third conductive barrier layer compring Ir, wherein said first conductive barrier layer is in contact with the layer of high dielectric constant material, said second conductive barrier layer overlies said first conductive barrier layer, and said third conductive barrier layer overlies said second conductive barrier layer;
   at least one metal layer in contact with the third conductive barrier layer, wherein said metal layer comprises metal or metal alloy including a material selected from the group consisting of Cu or Al:
   wherein said first,second and third conductive barrier layers are between said at least one layer of high dielectric constant material and said at least one metal layer.

* * * * *